(12) United States Patent
Deppert et al.

(10) Patent No.: US 7,223,444 B2
(45) Date of Patent: May 29, 2007

(54) PARTICLE DEPOSITION APPARATUS AND METHODS FOR FORMING NANOSTRUCTURES

(75) Inventors: Knut Wilfried Deppert, Lund (SE); Carl Martin Hall Magnusson, Lund (SE); Lars Ivar Samuelson, Malmo (SE); Thomas Johannes Krinke, Neuss (DE)

(73) Assignee: QuNano AB, Lund (SE)

( * ) Notice: Subject to any disclaimer, the term of this patent is extended or adjusted under 35 U.S.C. 154(b) by 3 days.

(21) Appl. No.: 10/258,866

(22) PCT Filed: May 4, 2001

(86) PCT No.: PCT/GB01/01972

§ 371 (c)(1),
(2), (4) Date: Oct. 29, 2002

(87) PCT Pub. No.: WO01/84238

PCT Pub. Date: Nov. 8, 2001

(65) Prior Publication Data

US 2003/0102444 A1    Jun. 5, 2003

(30) Foreign Application Priority Data

May 4, 2000    (GB) ................................. 0010800
Nov. 3, 2000   (GB) ................................. 0026958.9

(51) Int. Cl.
B05D 1/04    (2006.01)

(52) U.S. Cl. ..................... 427/466; 427/469; 427/475

(58) Field of Classification Search ........ 427/458–485, 427/552, 55
See application file for complete search history.

(56) References Cited

U.S. PATENT DOCUMENTS

| | | | |
|---|---|---|---|
| 3,108,894 A * | 10/1963 | Stowell ...................... 361/225 |
| 3,342,621 A * | 9/1967 | Guy et al. .................. 427/475 |
| 3,436,468 A | 4/1969 | Haberecht |
| 3,640,746 A * | 2/1972 | Haas .......................... 101/130 |
| 4,124,287 A | 11/1978 | Bean et al. ................. 355/3 R |
| 4,296,370 A | 10/1981 | Comizzoli et al. |
| 5,047,649 A * | 9/1991 | Hodgson et al. ......... 250/492.2 |
| 5,534,309 A * | 7/1996 | Liu ............................ 427/458 |
| 2003/0178316 A1 | 9/2003 | Jacobs et al. ............... 205/157 |

FOREIGN PATENT DOCUMENTS

EP    0171068    2/1986

(Continued)

OTHER PUBLICATIONS

Chou et al; "Imprint of sub-25nm vias and trenches in polymers"; Applied Physics Letters 67(21), Nov. 20, 1995, pp. 3114-3116.

(Continued)

*Primary Examiner*—Fred J. Parker
(74) *Attorney, Agent, or Firm*—Foley & Lardner LLP

(57) ABSTRACT

A fast method of creating nanostructures comprising the steps of forming one or more electrically-charged regions (5) of predetermined shape on a surface (1) of a first material, by contacting the regions with a stamp for transferring electric charge, and providing electrically charged nanoparticles (7) of a second material, and permitting the particles to flow in the vicinity of the regions, to be deposited on the regions.

44 Claims, 12 Drawing Sheets

FOREIGN PATENT DOCUMENTS

| | | |
|---|---|---|
| EP | 0260410 | 3/1988 |
| EP | 0 431 249 A | 6/1991 |
| EP | 0431249 | 6/1991 |
| EP | 0459700 | 12/1991 |
| EP | 0 480 183 A | 4/1992 |
| EP | 0480183 | 4/1992 |
| EP | 0576263 | 12/1993 |
| EP | 0865078 | 9/1998 |
| GB | 1597890 | 9/1981 |
| GB | 2148608 | 5/1985 |
| GB | 2267997 | 12/1993 |
| WO | WO 02/03142 | 1/2002 |

OTHER PUBLICATIONS

Liu et al; "Microfabrication of nanoscale cluster chains on a patterned Si surface"; Applied Physics Letters, Oct. 5, 1995, pp. 2030-2032.

Fudouzi et al; "An arrangement of micrometer-sized powder particles by electron beam drawing"; Advanced Power Technol., 1997, vol. 8, No. 3, pp. 251-262.

Saurenbach; "Electrostatic writing and imaging using a force microscope"; IEEE Transactions on Industry Applications, Jan. 1992, vol. 28, No. 1, pp. 256-260.

Uchiahashi et al; "Charge Storage on this SrTi $O_3$ film by contact electrification"; Japanese Journal of Applied Physics, 1994, vol. 33, pp. 5573-5576.

Donald et al; "Contact electrification and Lichtenberg figures on insulators"; Proceedings of the National Academy of Sciences of the USA, New York, NY, US, Oct. 1968, pp. 170-174, XP000952369.

Chen; "Development of electrostatic images with polarized toners"; Photographic Science and Engineering Society of Photographic Scientists and Engineers, Washington, US, May 1982, vol. 26, No. 3, pp. 153-157, XP000946922.

Jacobs et al; "Measuring and modifying the electric surface potential distribution on a nanometer scale: a powerful tool in science and technology"; Surface and Interface Analysis, 1999, vol. 27, pp. 361-367.

Jacobs et al; "Fabrication of a cylindrical display by patterned assembly"; Science, Apr. 12, 2002, vol. 296, pp. 323-325.

Jacobs, et al; "Resolution and contrast in Kelvin probe force microscopy"; Journal of Applied Physics, Aug. 1, 1998, vol. 84, No. 3, pp. 1168-1173.

Jacobs, et al; "Submicrometer patterning of charge in thin-film electrets"; Science, Mar. 2, 2001, vol. 291, pp. 1763-1766.

Kim, et al; "Two- and three-dimensional crystallization of polymeric microspheres by micromolding in capillaries"; Advanced Materials, 1998, vol. 8, No. 3, pp. 245-247.

Deppert, et al "Electrostatic precipitator for homogenous deposition of ultrafine particles to create quantum-dot structures"; J Aerosol Sci, 1996, supplement 1, pp. 151-152.

Deppert, et al; Sintered aerosol masks for dry-etched quantum dots!: Applied Physics Letters, Jun. 13, 1994, vol. 64, No. 24, pp. 3293-3295.

Fudouzi, et al; "Formation of electrified images using electron and ions beams"; Journal of Electrostatics, 1997, vol. 42, pp. 43-49.

Fukano, et al; "Phase transition of contact-electrified negative charges on a thin silicon oxide in air"; Journal of Applied Physics, 1996, vol. 35, pp. 2394-2401.

Junno, et al; "Controlled manipulation of nanoparticles with an atomic force microscope"; Applied Physics Letters, Jun. 26, 1995, vol. 66, No. 6, pp. 3627-3629.

Wright, et al; "Can charge writing aid nanotechnological manipulation?"; Nanotechnology, 1998, vol. 9, pp. 133-142.

Krinke, et al; "Structured deposition of nanoparticles from the gas phase of an aerosol"; Partec 2001, Mar. 27-29, 2001.

Frohbach; "Electrostatic Electrographic Printing"; IEEE Transactions on Electron Devices, Apr. 1972, vol. ED-19, No. 4, pp. 579-584.

Krinke, et al; "Microscopic aspects of the deposition of nanoparticles from the gas phase"; Journal of Aerosol Science 33 (10): 1341-1359 Oct. 2002.

Krinke, et al; "Nanostructured deposition of nanopartices from the gas phase"; Particle & Particle Systems Characterization 19 (5): 321-326 Nov. 2002.

Singh, et al; "Approaches to increasing yield in evaporation/condensation nanoparticle generation"; Journal of Aerosol Science 33 (9): 1309-1325 Sep. 2002.

Maximov, et al; "Fabrication of Si-based nanoimprint stamps with sub-20 nm features"; Microelectronic Engineering 61-2: 449-454 Jul. 2002.

Magnusson, et al; "Size-selected gold nanoparticles by aerosol technology"; Nanostructured Materials 12 (1-4): 45-48 Part A Sp. Iss. Si Jul. 1999.

Junno, et al, "Single-electron devices via controlled assembly of designed nanoparticles"; Microelectronic Engineering 47 (1-4): 179-183 Jun. 1999.

Deppert, et al; "Aerosol fabrication of nanocrystals of InP"; Japanese Journal Of Applied Physics Part 1 38 (2b): 1056-1059 Feb. 1999.

Kruis, et al; "Report on the 3rd Meeting of the European Aerosol Assembly Working Group on Nanoparticles in Aerosols"; Sep. 17, 1997, European Aerosol Conference 1997, Hamburg, Journal of Aerosol Science 29 (3): U5-U6 Mar. 1998.

Deppert, et al; "Size-selected nanocrystals of III-V semiconductor materials by the aerotaxy method"; Journal Of Aerosol Science 29 (5-6): 737-748 Jun.-Jul. 1998.

Deppert, et al; "A new method to fabricate size-selected compound semiconductor nanocrystals: Aerotaxy"; Journal Of Crystal Growth 169 (1): Nov. 13-19, 1996

Anand, et al; "Electron transport at Au/InP interface with nanoscopic exclusions"; Journal of Vacuum Science & Technology B 14 (4): 2794-2798 Jul.-Aug. 1996.

Deppert, et al; "Self-limiting transformation of monodisperse Ga droplets into GaAs nanocrystals"; Applied Physics Letters 68 (10): 1409-1411 Mar. 4, 1996.

Junno et al; "Contact mode atomic-force microscopy imaging of nanometer-sized particles"; Applied Physics Letters 66 (24): 3295-3297 Jun. 12, 1995.

Junno, et al; "Controlled manipulation of nanoparticles with an atomic-force microscope"; Applied Physics Letters 66 (26): 3627-3629 Jun. 26, 1995.

Deppert, et al; "Sintered aerosol masks for dry-etched quantum dots"; Applied Physics Letters 67 (24): 3293-3295 Jun. 13, 1994.

Krinke, et al; "Deposition of aerosol nanopartices on flat substrate surfaces"; Phase Transitions 76, 333-345 (2003).

Krinke, et al; "Positioning of nanometer-sized particles by direct deposition from the gas phase"; Appl. Phys. Lett. 78, 3708-3710 (2001).

Donald D.K.; "Contact Electrification and Lichtenberg Figures on Insulators"; Preceedings of the Natl Academy of Sciences of the USA, New York, NY, US, Oct. 1968; pp. 170-174, XP000952369.

Chen I.; "Development of Electrostatic Images with Polarized Toners"; Photographic Science and Engineering, Scoiety of Photographic Scientists and Engineers, Washington, US; vol. 26, No. 3, May 1982; pp. 153-157, XP000946922.

* cited by examiner

— Homogeneous particle distribution due to electric field of ESP

Particle free zone

— High particle density due to
— Attractive surface charges

Particle free zone

— Homogeneous particle distribution due to electric field of ESP

Fig.13.
Fig.14.
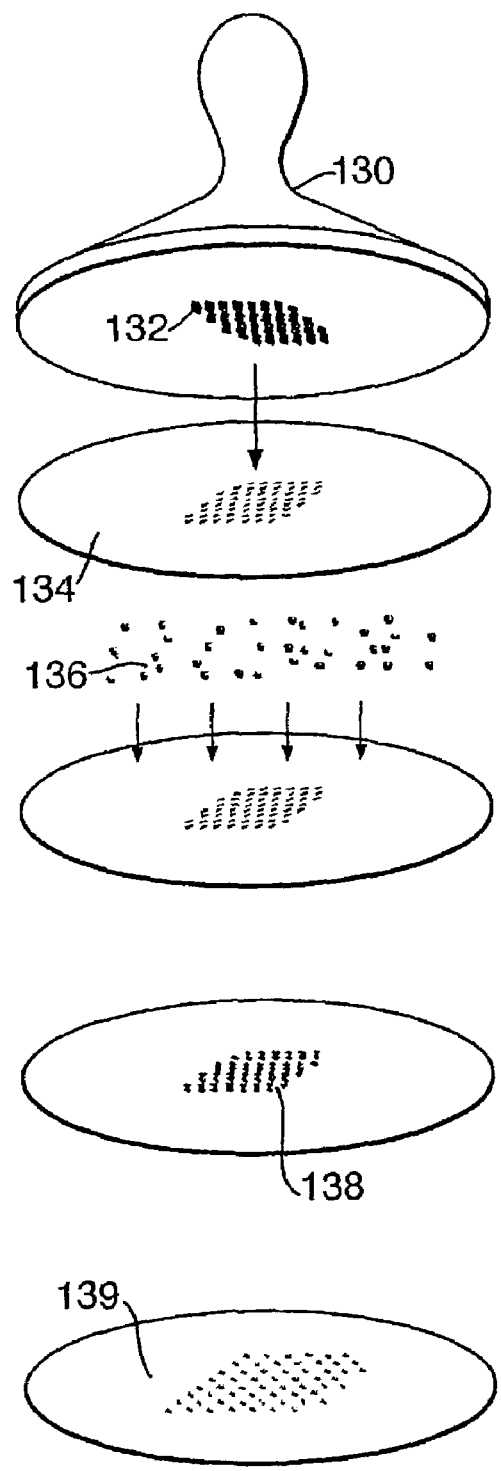
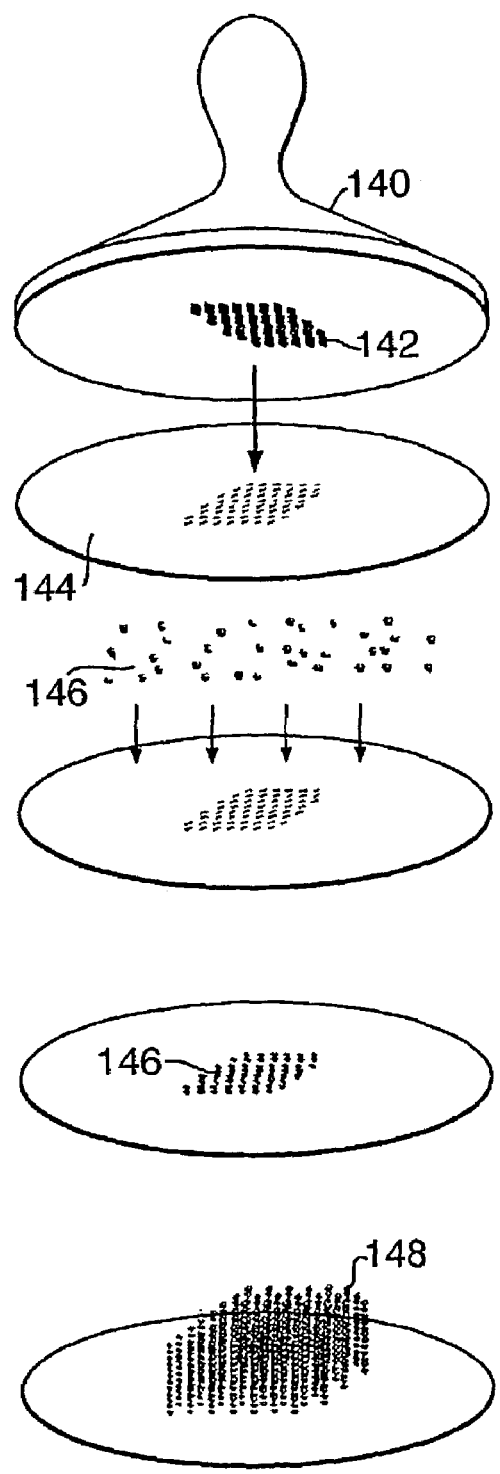

PARTICLE DEPOSITION APPARATUS AND METHODS FOR FORMING NANOSTRUCTURES

This invention relates to a method of forming structures of small dimensions, for example of nanometer dimensions—commonly known as nanostructures—and also relates to methods involving interaction of small particles, especially nanometer dimensioned particles with material surfaces.

Hitherto, small-scale photonic or electronic devices have been fabricated using photolithographic processing techniques. As sizes are reduced, it becomes difficult to form the individual geometric features of these devices at a sufficient degree of resolution due to the need to employ radiation of ever-shorter wavelengths to expose the photoresist.

A process that presses a mould into a thin thermoplastic polymer film on a substrate to create vias and trenches with a minimum size of 25 nm is disclosed in "Imprint of sub-25 nm vias and trenches in polymers" Chu et al, Applied Physics Letters 67(21), 20 Nov. 1995, pages 3114–3116.

Nanometer-sized metal and semiconductor particles (nanoparticles) may be regarded as potential components for photonic or quantum electronic devices. Fabrication of these devices requires not only deposition but also positioning of nanoparticles on a substrate. There are many different ways of creating nanometer-scale structures using particles or clusters as building blocks, such as deposition from a suspension using capillary forces, which gives two- and three-dimensional arrays of crystal-like structures of particles.

Nanometer-scale chains of metal clusters have been fabricated with a resolution better than 200 nm. They nucleate at the boundary of the substrate and lines of photoresist during deposition of copper—"Microfabrication of nanoscale cluster chains on a patterned Si surface", Liu et al, Applied Physics Letters, 5 Oct. 1995, p 2030–2032.

"An arrangement of micrometer-sized powder particles by electron beam drawing", Fudouzi et al, Advanced Powder Technol., 1997, vol. 8, no. 3, pp 251–262, reports that electrically charged lines on the scale 20 μm may be written in an insulating surface. It is shown that charged silica spheres (5 μm diameter) in a suspension can be controllably directed towards such charged lines.

On the topic of electrically charging surfaces, "Electrostatic writing and imaging using a force microscope" Saurenbach, IEEE Transactions on Industry Applications, Volume 28 No. 1, January 1992, page 256 discloses the use of an electrostatic force microscope having a tungsten microscope tip, arranged to touch a polycarbonate surface with a small voltage to transfer charge to the surface in order to produce "charge spots" of micrometer dimensions.

"Charge storage on thin Sr Tr $O_3$ film by contact electrification" Uchiahashi et al, Japanese Journal of Applied Physics, Volume 33 (1994), pages 5573–5576 discloses charge storage on thin film by contact electrification, by using an atomic force microscope. It was possible to discriminate between charge dots spaced about 60 nm apart. The process is intended for non-volatile semiconductor memories.

SUMMARY OF THE INVENTION

It is an object of the present invention to provide an improved method by which devices having very small geometric features may be fabricated.

The concept of the present invention is to induce an electric charge in very small, as small as nanometric-dimensioned areas, on a surface, preferably by contacting a metallic tool in a controlled manner on an insulating substrate. As a second step in the invention, nanometric-dimensioned particles in an aerosol or in liquid phase are then influenced by the regions of electric charge on the substrate in order to be deposited on the substrate or otherwise to interact with the substrate as explained below.

In a first aspect, the invention provides a method comprising the steps of forming one or more electrically-charged regions of predetermined shape on a surface of a first material, by contacting said regions with a tool means for transferring electric charge, and providing particles of a second material, and permitting the particles to flow in the vicinity of said regions, to interact in a predetermined manner with the electric charge of the said regions.

In a second aspect, the invention provides apparatus for carrying out a method comprising tool means for contacting one or more regions of predetermined shape on a surface of a first material in order to transfer electric charge thereto, and means for permitting particles of a second material to flow in the vicinity of said regions, to interact in a predetermined manner with said regions.

In a further aspect, the invention provides a method, comprising the steps of forming one or more electrically-charged regions of predetermined shape on a surface of a material, providing particles of nanometric dimensions, and permitting the particles to flow in the vicinity of said regions to interact in a predetermined manner with said regions.

For the purposes of the present specification, "particles of nanometric dimensions" is intended to means particles having a diameter of 300 nanometers or less. As preferred for most applications, the particle diameter is 50 nanometers or less, and as further preferred, in some applications, for example optoelectronics, the particle diameter is 10 nanometers or less.

The tool means may be a press or stamp having a contoured surface of dimensions as large as millimeters or as small as nanometers, which is arranged to contact the surface of the substrate, and has a configuration conforming to the desired pattern or configuration of electric charge to be deposited on the substrate. The press or stamp may be of a rigid material, or a resilient material, e.g. a metal coated rubber material.

A significant advantage of employing a stamp is that a complex configuration of electrically charged regions of predetermined shape, extending over a wide area, may be formed in a single operation. The process of the invention is therefore very much faster to carry out than other methods, such as electron beam drawing or writing.

Alternatively the tool may take the form of a needle, rod or other elongate object which is drawn across the surface in a desired path to create the desired pattern of electric charge. The tool may be the tip of a scanning probe microscope. The tool will usually be of metal but can be of any other suitable rigid material having a work function which is such in relation to the work function of the first material to permit charge flow to the surface of the first material. The first material is commonly an insulating material, but may be semiconducting or of any material which is such as to hold the applied electric charge for a sufficient length of time to permit the method of the invention to take place.

In addition to the locally charged regions, deposition of the second material may be assisted by application of an electrostatic precipitation field.

Preferably, the particles of the second material have a second electrical charge of opposite sign to the first. Alternatively, the particles of the second material may be of the same sign as that of the first electric charge, and the pattern of the deposited second material is determined by the repulsion from the one or more electrically charged regions.

The requirement that the particles be charged may in some cases be relaxed—particles may become polarised in an electric field and will be attracted towards electrostatically charged objects due to an electric field gradient.

In another application, electrically neutral nanometric particles may be projected against a surface, each to absorb one or more charge carriers, and to rebound from the substrate in an electrically charged condition.

As well as contact charging, other mechanisms may be employed for the creation of locally-charged regions, including inducing a charge pattern by irradiation with photons, e.g. by synchrotron light using a mask, or inducing a charge pattern by laser interference on a polar semiconductor surface.

The particles of a second material may be formed by any suitable process. A preferred process of producing the particles in aerosol form is described below. Alternatively other processes such as laser ablation may be employed.

BRIEF DESCRIPTION OF THE DRAWINGS

Preferred embodiments of the invention will be now be described merely by way of example with reference to the accompanying drawings, in which:

FIGS. 10–20 are schematic drawings showing various embodiments of the present invention.

DESCRIPTION OF THE PREFERRED EMBODIMENTS

Figure 1:
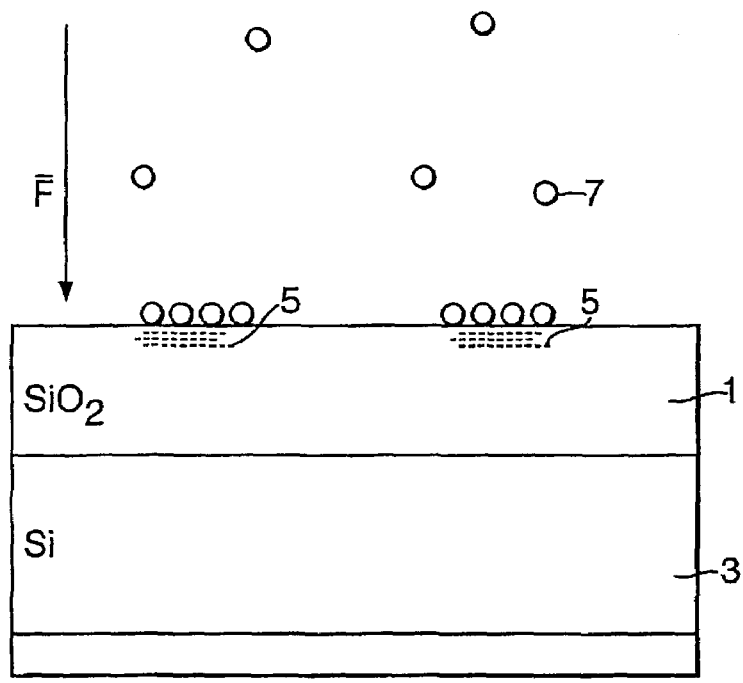
FIG. 1 is a schematic diagram illustrating the method of the invention.

Referring now to the FIG. 1 of the drawings, the surface of a silicon wafer 3 is oxidised to produce a silicon dioxide layer 1, and localised regions 5 of negative charge are imprinted on the surface. Nanoparticles 7 formed in an aerosol unit are impressed with a positive charge and are attracted to the locally charged regions 5 of the silica surface layer, with the assistance of a local electric field F.

Figure 2A:
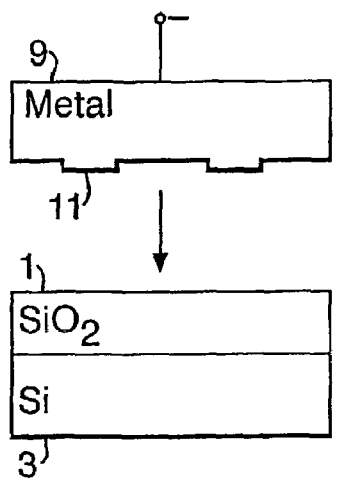
FIGS. 2a to 2c is a sequence illustrating the application of electrical charge to receptor regions of an insulating surface in accordance with the invention.
Figure 2B:
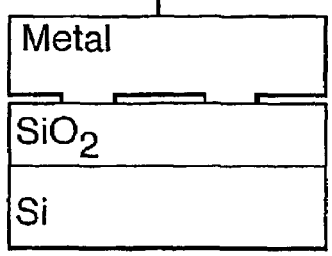
Figure 2C:
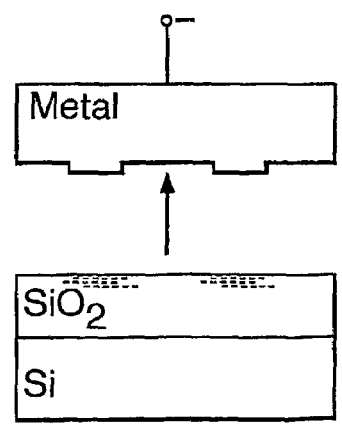

One method of applying the local charge to the surface is illustrated in FIG. 2a to 2c. A nanoprinting stamp 9 is made from a conducting material (or from an insulator coated with a metal), and is brought into contact with the insulating surface 1. The stamp 9 has protrusions 11 formed on its contact surface in a predetermined configuration. The width of these protrusions may range from dimensions of nanometers up to the macroscopic millimeter range, preferably fabricated by electron beam lithography. The height of the protrusions is not material to the region definition. After contact, localised charged regions are left on the surface 1 of the substrate exactly mirroring the dimensions and structures of the stamp protrusions.

The basis of this method is that charges cross the interface of an insulator and a metal brought into contact. After the metal is removed, a charge is retained on the insulator. The sign and amount of charge transferred depends approximately linearly on the work function or Free Energy of the metal in relation to the work function or Free Energy of the insulating substrate. The amount of charge may be increased by providing a potential difference between the metal and the insulator. It is estimated that, with the method of this preferred embodiment, $10^5$ charges per square micrometer or less are transferred.

Figure 3:
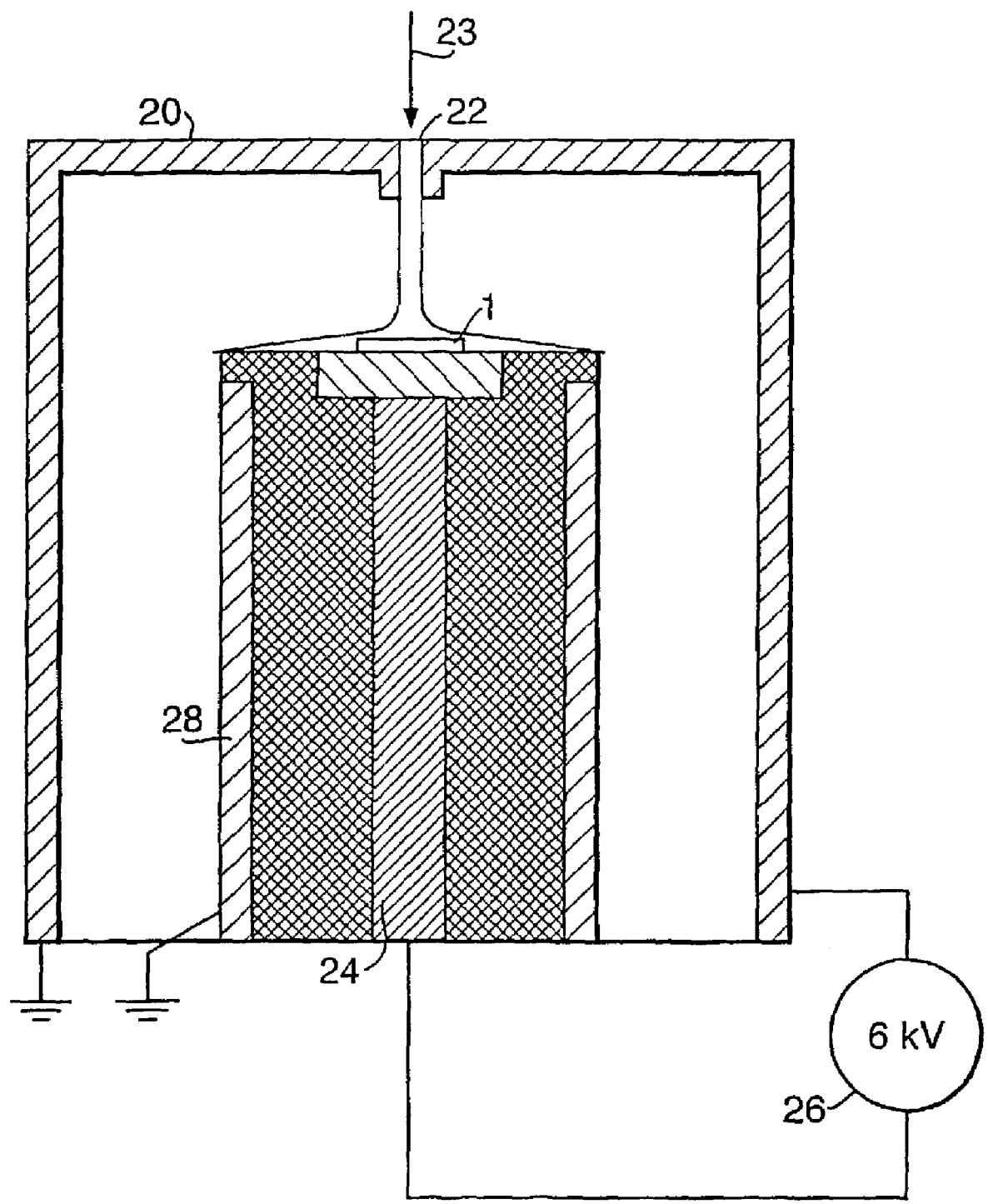
FIG. 3 is a schematic view of a deposition chamber (precipitator) for an aerosol nanoparticle generator, for the method of the invention.
Figure 4:
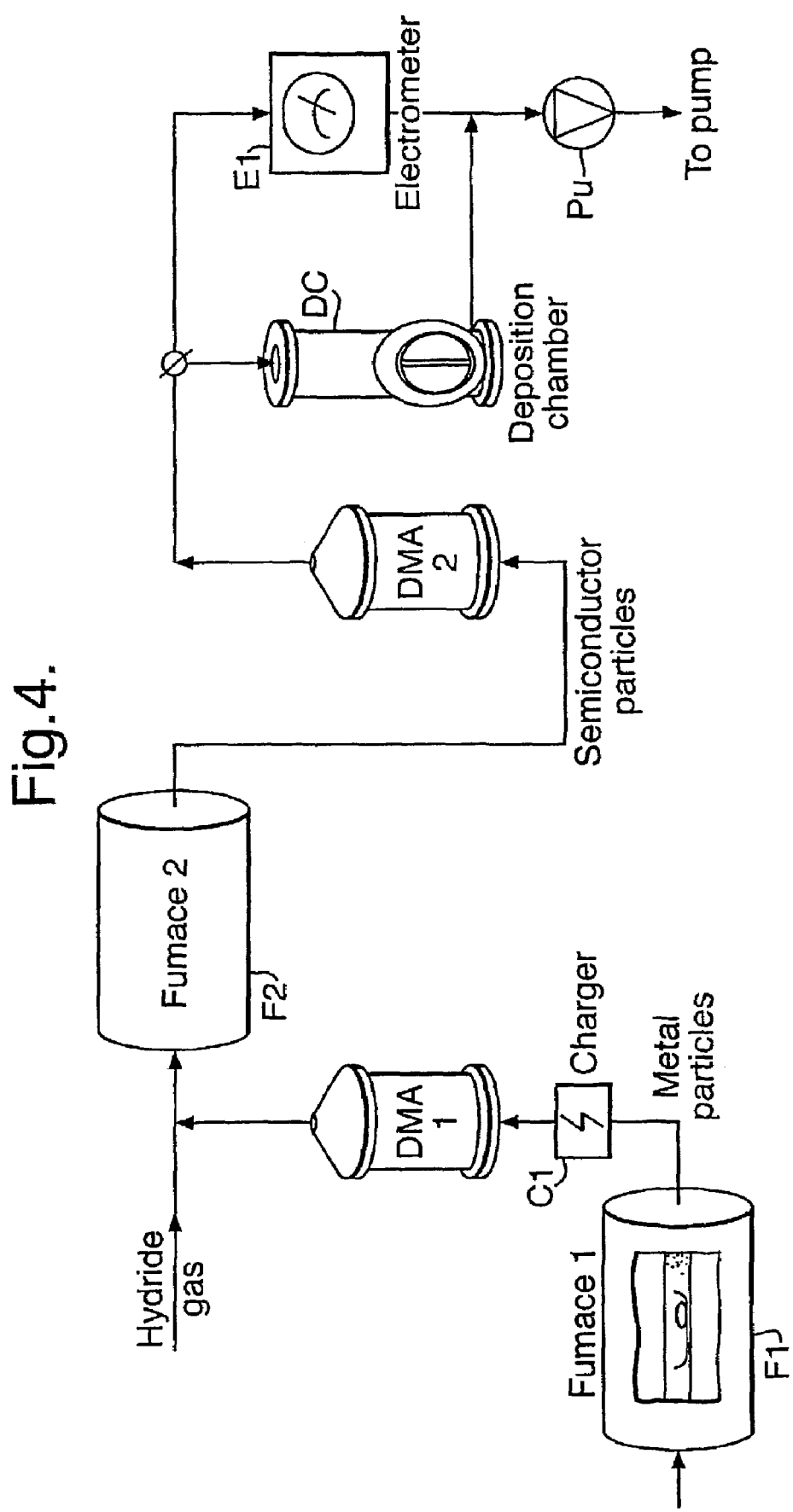
FIG. 4 illustrates, in diagrammatic form, an aerosol nanoparticle generator, described in our co-pending PCT Application No. GB98/03429.
Figure 5:
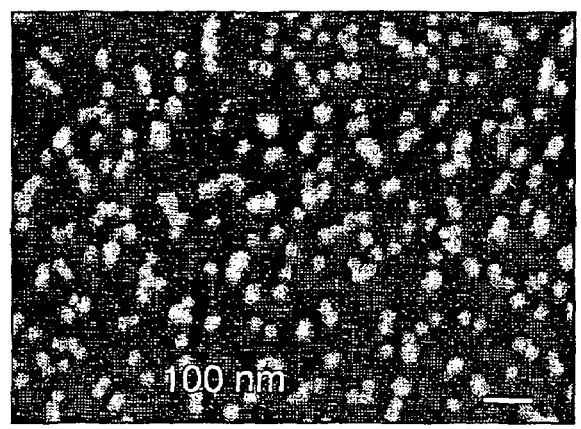
FIGS. 5a–c to 9 are scanning electron micrographs of surfaces of materials having particulate deposits thereon, formed in accordance with the invention.
Figure 6:
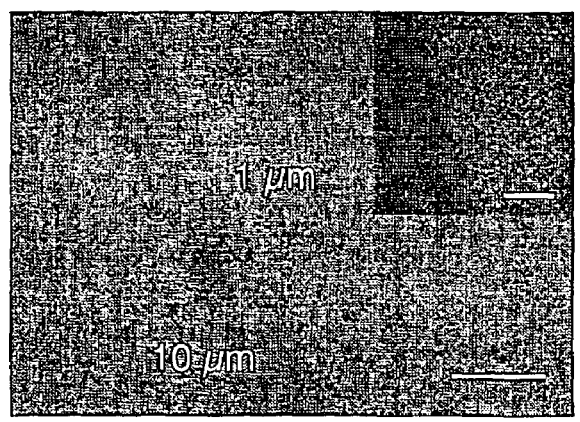
Figure 7:
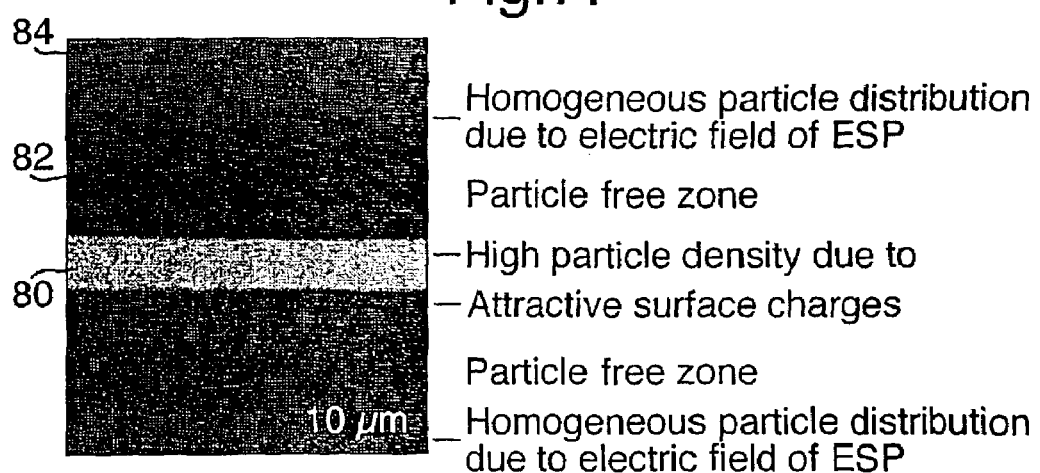

The substrate, which now has a pattern of charge on its surface 1, is placed in a deposition chamber or precipitator for an aerosol nanoparticle generator as shown in FIG. 3. The generator produces particles with a controlled charge, either positive or negative. If the aerosol particles have a polarity opposite to that of the charge on the surface of the substrate, the particles will preferentially deposit where the substrate is charged (FIG. 1), whereas particles with the same polarity as the surface charge pattern will be repelled from the pattern, and are deposited in the spaces between the locally charged regions. In the case of no applied electric field, particles with opposite charge states will still deposit where the substrate is charged, whereas particles with the same polarity as the surface charge pattern will not be deposited.

Further processing steps may then be undertaken to fix the particles permanently to the surface.

Referring to FIG. 3 there is shown a chamber 20 which is electric grounded having an inlet 22 in its upper wall for receiving particles 7 in the form of an aerosol. A electrode 24 in the chamber is connected to a source of potential 26 in order to generate an electric field between the electrode and the walls of the chamber. The electrode 24 is mounted on an insulating tube 28. The electrically charged sample 1 is placed on the upper surface of the electrode 24. The sample is a distance of some centimeters from the opening 22.

In use, particles 23 entering the chamber through opening 22 flow towards sample 1. The electric charge on the sample as shown in FIG. 1 may be sufficient to attract the particles for deposition. However, as shown, the deposition may be assisted by the electric field existing between electrode 24 and the walls of chamber 20.

In this case, the particle deposition may take place (a) by attracting particles of a different polarity to the charged regions and (b) by deflecting particles from the charged regions. In the first case particles are deposited at the charged regions but are also deposited on areas in between the regions with lower density and randomly. This is dependent on the distances between the fields, the strength of the macroscopic electric field applied, the particle size, and the particle speed in the gas flow. In the second case particles would only be deposited in between the charged regions.

Furthermore, this embodiment may be adapted so as to use instead of particles in an aerosol, colloidal particles from the liquid phase, which will also be attracted by the charge patterns.

Other methods of bringing the particles close to the surface, which do not rely on an macroscopic electric field, may be used, e.g., inertial impaction or thermophoresis.

Whilst the creation of charge patterns can easily be demonstrated for insulating surfaces, the method may also be used for semiconductor and metal surfaces, although the amount of charges and the time duration of charges might be smaller as compared with insulating surfaces.

An additional feature is that the substrate itself or the active surface layer can be very thin—just a few nanometers, for example 50 nm. This facilitates the creation of a charge pattern on one side while the particles are deposited on the other side of a substrate. This may enable the stamping apparatus shown in FIG. 2 to be incorporated in the deposition chamber shown in FIG. 3 in that the sample may be held in place within the chamber and the stamping apparatus is brought against the underside of the sample to impart a pattern of electric charge (the upper surface of the electrode may form the stamp). This charge will then be effective to attract aerosol particles streaming down onto the upper surface of the sample. The thickness of this substrate is limited simply by the dielectric constant of substrate material, the number of charges stored in the surface and the electric mobility of the particles, which itself is a function of the particle size, the number of charges on the particles and the medium in which the particle is suspended. Thus, thin foils could be used as substrate materials.

In order to generate electrically charged particles for depositing on the substrate surface in the apparatus as shown in FIG. 3, the apparatus of FIG. 4 is employed in this embodiment. This is an aerosol generator capable of producing an aerosol with a volume flow of 1680 $cm^3$/min and a particle concentration of around $5\times10^5$ $cm^{-3}$ was used for particle generation. In FIG. 4, a furnace F1 generates metallic particles by sublimation. An electrical charger C1 is placed after the furnace to charge the aerosol particles. Size selection takes place in a differential mobility analyser DMA1. DMA apparatus exploits the fact that the electrical mobility of singly charged particles is a monotonically increasing function of particle size. While sending a flow of electrically charged particles in a perpendicular electric field, the field causes particles to be attracted to one capacitor plate. Particles with higher electrical mobility will be precipitated on the nearest portion of the plate and those with lower mobility will be carried along with the main flush flow. Only those with the correct mobility, and hence particles size, will be attracted to the facility of the sampling slit where they are swept out by the gas stream flowing through the slit. The DMA can produce particles with a closely controlled dimension, to within a standard deviation of a few percent. These particles are conducted to further furnace F2 where they are mixed with a hydride gas in order to produce further particles of a further composition. These particles are subject to a close dimensional control in a further DMA2. For a given particle diameter, a distribution of diameters of ±0.2 of the diameter is achieved. The diameter of the particles may be as small as 5 nm, or even molecular size. These particles are conducted to a deposition chamber DC, which is as shown in FIG. 3. An electrometer E1 and a pump Pu are connected to measure the particle concentration and to create a gas flow therein for flowing the particles into the deposition chamber or precipitator.

The carrier gas is ultra pure nitrogen at ambient pressure and room temperature. Due to the generation process, the particles carry either one positive or one negative charge. For deposition, the aerosol flows into the apparatus shown in FIG. 3. A stagnation point flow was established over the substrate. An electric field guides the charged particles towards the substrate surface where they are deposited. In the absence of this field, the particles follow the streamlines of the carrier gas and no deposition occurs. Thermal wet oxidised silicon (111) with oxide thickness of 500 nm and a plane surface were used as substrates. The silicon was p+ doped with 0.01 to 0.02 Ω-cm resistivity. No special cleaning process was carried out except that of removing coarse particles by blowing with nitrogen.

As an alternative to using a stamp, contact charging of the substrate surfaces may be carried out with a stainless steel needle that is slid over the substrate surface without applying pressure, both needle and substrate being earthed For sample evaluation, scanning electron microscopy (SEM) was used to obtain the particle arrangement on the substrate surfaces.

FIG. 5 shows the homogeneous distribution of particles that is obtained after deposition of negatively charged, 30 nm indium particles in the homogeneous electric field of the electrostatic precipitator with 150 kV/m electric field strength. The particles are attracted to the surface by the macroscopic electric field. Their macroscopic distribution is homogeneous over the whole sample area. The same behaviour is obtained for the deposition of positively charged particles in a negative field.

When negatively charged particles are deposited at 150 kV/m on a substrate, which has previously been patterned with lines of negative surface charges, as shown in FIG. 6, particle-free zones show up within the homogenous particle distribution. FIG. 6 is a scanning electron micrograph that shows that these zones are approximately 10 μm in width. At their border is a narrow transition region (shown in the inset) with a width of around 300 nm in which the particle density increases from zero to the mean density found on the rest of the substrate. The pattern of particle free zones observed after the deposition corresponded to the pattern applied with a steel needle. This indicates a negative charging of the contact area between substrate and needle.

In the case of deposition of positively charged particles with a homogeneous electric field of ~150 kV/m on a negative charged substrate, particles are deposited as shown in FIG. 7 in an approximately 10 μm line 80 lying in the centre of a 200 μm particle free zone 82. The particle density within this line 80 is higher by a factor of approximately 5–10 compared to the mean density on the rest of the sample. Again, the borders of the different areas are very sharp. The lines were situated where the steel needle traversed the substrate. In regions 84, remote from line 80, deposition by electrostatic precipitation occurred.

For the fabrication of microelectronic components, it is often desirable to cover certain areas of a substrate selectively with a single material, such as gold, while the rest has to remain clean. This means that it is preferable to avoid the uncontrolled coverage of the substrate caused by the electric field of the electrostatic precipitator. Depositing positively charged particles on a charged substrate with the electrostatic precipitator turned off, i.e. no electric field applied, the surprising result is that the amount of charges on the substrate is sufficient to attract the particles from the gas flow. This means that the deposition becomes very selective and only the parts of the sample that are charged will be covered with particles. Line width of approximately 10 μm can be achieved. When the same process was carried out with negatively charged particles no particles at all were deposited.

When handling the substrate under ambient conditions the surface will have a contamination layer consisting mainly of water. During the contact electrification, charges are trapped in the silicon oxide surface as well as in the contamination layer. The latter are mobile and can move within the contamination layer. This leads to a broadening of the charge patterns on the surface. Using surfaces without this contamination layer improves the sharpness of the boundary between charged and non-charged regions. As preferred therefore, measures and means are employed to remove or prevent the formation of the water contamination zone, such as heating the substrate in a water-free atmosphere.

Figure 8A:
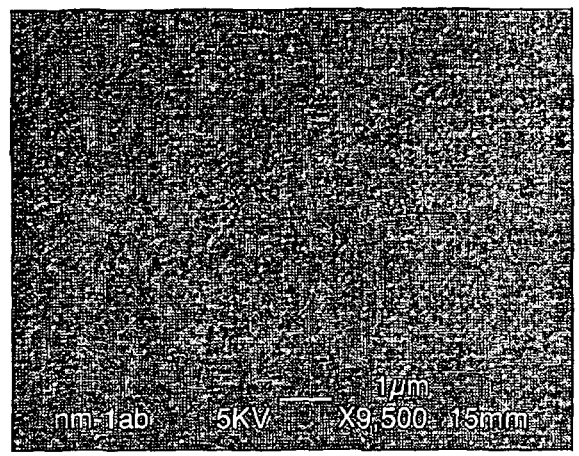
Figure 8B:
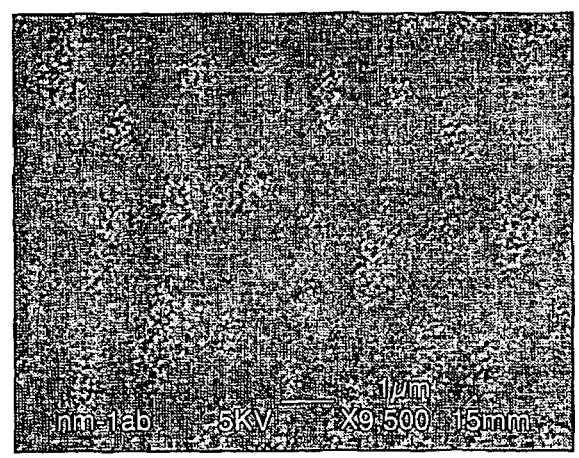
Figure 8C:
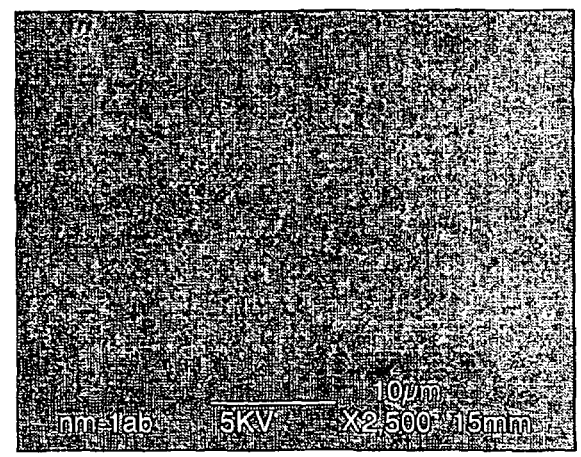

In one specific embodiment, silicon with a 1 µm layer of oxide was pressed against a Compact Disc (CD) master. A CD master is a metal plate with protrusions corresponding to where the depressions in the CD will be. These protrusions are on the scale of 1 µm. The result after aerosol particle deposition is shown in scanning electron micrographs (FIGS. 8a to c). This demonstrates that particles gather on the contact electrified spots. FIG. 8a is the case for a uniform deposition with no locally charged regions. FIG. 8b, on the same scale as FIG. 8a, shows the deposition on locally charged regions by pressing with the CD master. FIG. 8c is a reduced scale view of FIG. 8b.

Figure 9:
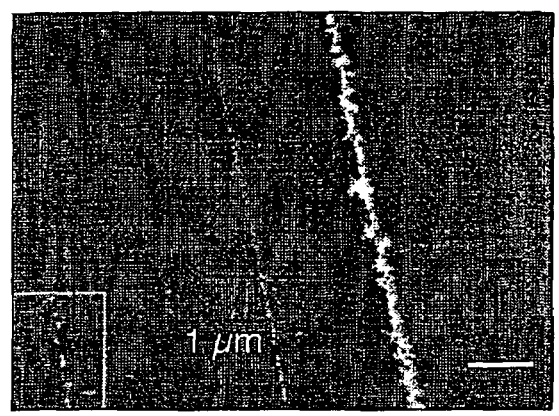
Figure 10A:
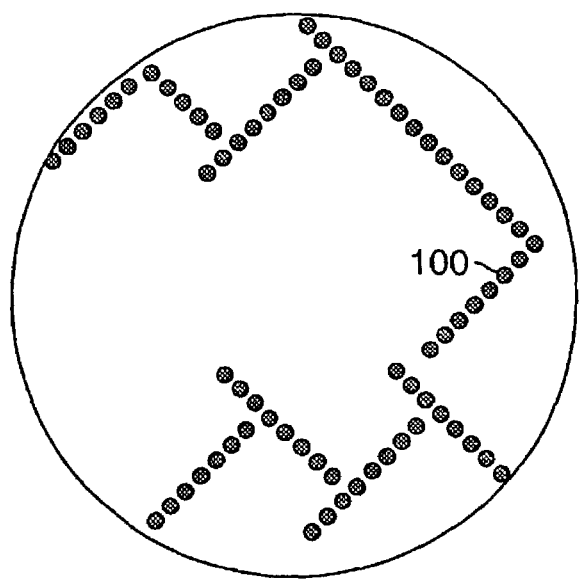
Figure 10B:
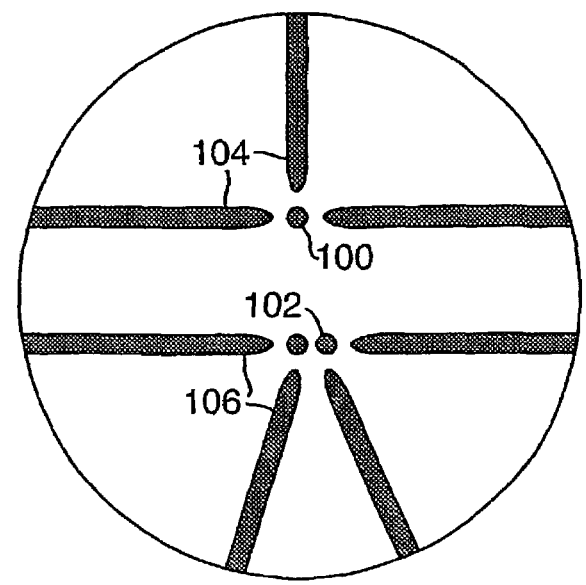
Figure 11:
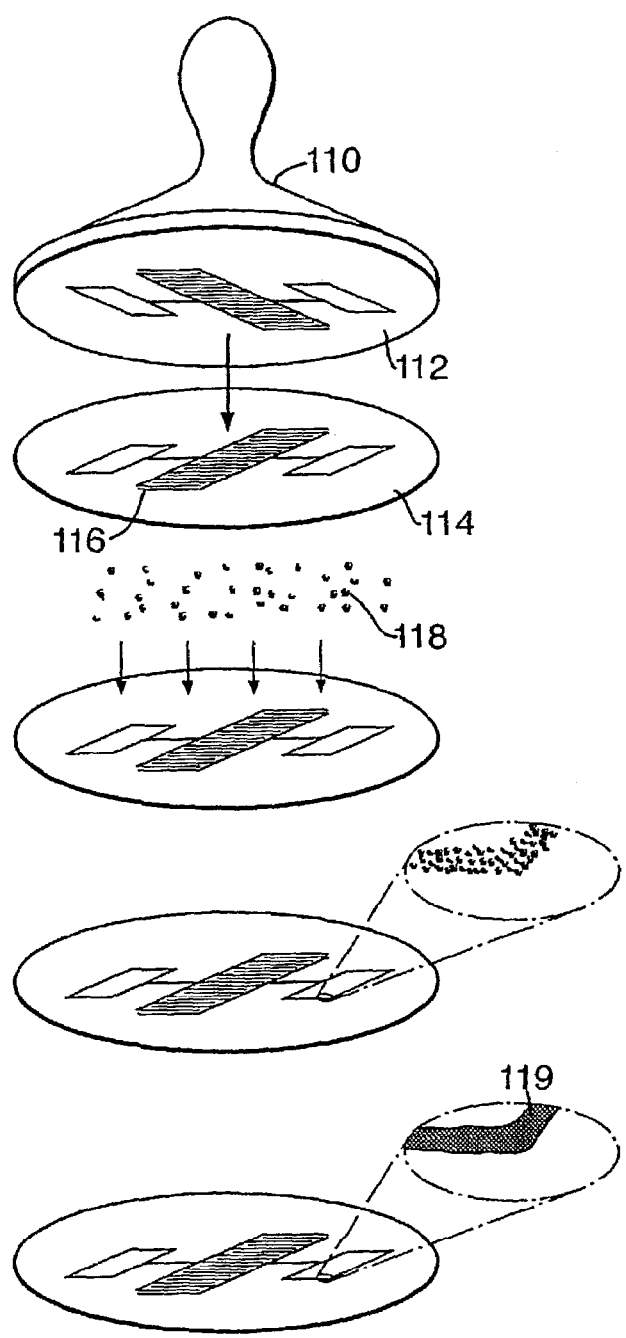

In accordance with a specific embodiment of the invention, as shown in FIG. 9, lines were made by gently sliding a metal needle against an insulating ($SiO_2$) surface. This shows that it is possible to collect positively or negatively charged particles with or without applying an external electric field in the precipitator. A resolution below 50 nm may be attained.

It is possible to cover a surface with nanometer resolution with substances that can be electrically charged and dispersed in a carrier gas. The size range of the building blocks ranges from several hundreds of nanometers down to individual molecules. The flexibility of this process permits the creation of structures with resolutions from the millimeter size range (e.g. sensors) down to the 100 nm or even lower size range (e.g. quantum devices). This makes the connection between the macroscopic and the nanoscale world possible in one process step. Another result that could be observed is that it is possible to arrange particle chains of different particle densities closely beside one another.

For the fabrication of electronic nanostructures, it is desirable that the charging process should neither destroy nor contaminate the substrate surface. Provided that one chooses the correct material combination, e.g., a sufficiently hard material is pressed against a softer surface, then the surface will elastically deform without permanent deformation, provided the contact pressure is sufficiently low. A hard material will not damage the substrate since the harmless contact is just sufficient to create the charge pattern and no forces will be applied. Actually, creating surface defects, e.g. scratches, will ruin the effect of contact charging. With a softer material, i.e. where the bonds between the surface and the bulk atoms are not strong, it is possible that material might remain on the surface after the contact.

The limitations for structural resolution of the method for fabricating distinct structures on a surface are mainly given by the number of charges stored in the surface, the number of particles deposited, and the electrical mobility of the particles. The electrical mobility is a function of the particle size, the number of charges carried by the particle and the medium the particle is suspended in.

This invention finds particular application in circumventing the limits of conventional photolithography. As circuits get ever smaller, the number of layers of metal lines (called vias) used to connect the devices on the chip increases, becoming one of the largest components of the cost of chip manufacture. Each layer of metal requires a separate lithographic step, where photoresist is applied, exposed, and developed, followed by evaporation of metal, and finally lift-off of excess metal. Here, it permits the fabrication of leads with nanometer dimension without any lithography step and without destroying the underlying structure.

Even the subsequent deposition of different material or different material sizes is possible by first creating a charge pattern and deposition of one sort of particles followed by a second charge pattern creation and another particle deposition. Here, a fixation step for the initially deposited particles might be necessary, such as annealing.

The present invention may also be utilised to replace the very fine lithography employed in making chemical or biological sensors. It may also be used for fabricating catalytic structures.

Optical detectors with sub-picosecond response times have been made with (very slow) electron beam lithography and metallisation. In this way, interdigitated Metal-Semiconductor-Metal junctions are formed with lateral metal-metal spacing of below 50 nm. With method of this invention, an entire optoelectronic device may be fabricated very efficiently, such as optoelectronic components based on nanoparticles. For some of these, ordering of the particles on the scale of the wavelength of the light is crucial. Among such components are quantum dot based laser and light emitting diodes.

The method may also be used in photonic bandgap materials—particles placed in arrays ordered on the scale of the wavelength of light which exhibit a band gap for the photons, so that some wavelengths are not permitted to pass. This has applications in optical communication.

The invention also finds application in the fabrication of interference colouring and anti-reflective coatings and for the construction of nanostructured surface, which exhibit unique tribological properties, such as wear resistance.

Further application could be found in the fabrication of magnetic storage devices, flash memory devices, electroluminescence displays. Also for the controlled seeding of the growth of nanotubes and nanowhiskers, the present invention can be applied.

Additionally, projecting neutral particles with a higher speed towards surface regions charged by the method would lead to a charge transfer from the surface to the particles permitting particles scattered by the surface to acquire a charge.

The invention also finds application in the removal of particles from a gas or a liquid.

Referring now to FIG. 10, this shows examples of Coulomb—blockade devices created by the method in accordance with the invention. FIG. 10*a* shows chains of nanoparticles 100 forming wireless single-electron logic based on electrons hopping between nanoparticles. FIG. 10*b* shows single electron transistor structures with central nanoparticles 100, 102 influenced by electrodes 104, 106.

FIG. 11 is a schematic diagram of the method in accordance with the invention applied to fabricating nanometer-size metallic circuit structures. A stamp 110 (shown conceptually) having a predetermined shape 112 is pressed against a substrate 114 to create a corresponding pattern of charged regions 116. Metallic particles 118 of an opposite charge type are then deposited on the substrate to adhere to the pattern 116. After an annealing step, the particles merge to form continuous metallic features 119.

Referring now to FIG. 12 this shows creation of multi-metallic surface structures by controlled nanoparticle deposition in accordance with the invention. A stamp 120 is pressed against a substrate 122 to form a pattern of charged regions 124 on the substrate, on which oppositely charged nanoparticles 125 are deposited. The particles are then fixed on to the substrate by a suitable process. A further stamp 126 with a different stamp pattern is pressed against substrate 122 to produce a second pattern 128 of charged regions. This permits nanoparticles 129 of a different type to land on the second charged region.

Referring to FIG. 13, showing the fabrication of quantum dot lasers by the method in accordance with the invention, wherein stamp 130 with metallised protrusions 132, having dimensions of less then 20 nanometers, is pressed against a substrate 134. The material of the substrate is in this example the n-type part of a laser structure; alternatively the substrate may constitute the p-type part of the laser. The metallised protrusions create charged regions or spots on the substrate to permit particles 136 to be deposited on the localised charge regions to create a pattern of n-type laser-active quantum dots 138. After epitaxial overgrowth of the particles as at 139 with a p-type substrate to create the laser structure, the system is ready for final processing.

Figure 12:
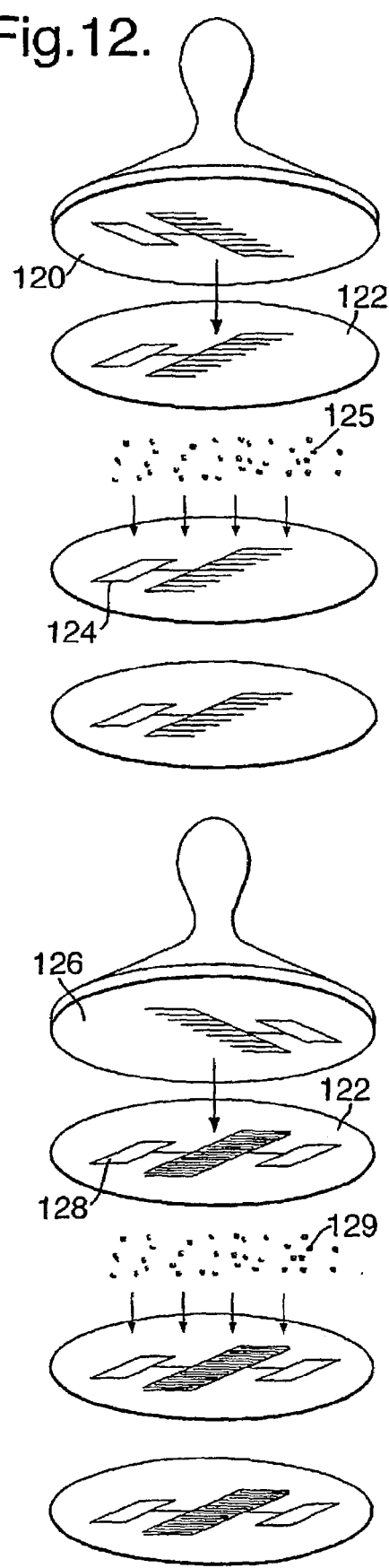

The procedures of FIGS. 12 and 13 may be essentially combined, in that repeated operations of depositing p- or n-type particles, forming parts of laser structures, can be carried out, each operation employing particles of a different diameter, and hence laser characteristics, e.g. wavelength. Finally, an epitaxial overgrowth is carried out, as in FIG. 13.

Referring now to FIG. 14, there is shown the fabrication of photonic band gap materials by a method in accordance with the invention wherein a stamp 140 having metallised protrusions 142 with lateral dimensions of the order of one quarter of the wavelength of the light in question (for example about 10 micrometers) is pressed against a substrate 144 to create charged regions of a similar pattern. Micrometer sized particles 146 are then deposited on the substrate to accumulate on the locally charged regions. By prolonged deposition, particles will land on top of each other to create filaments 148 or chains of particles. This creates filaments in a desired lattice structure having dimensions of the order of the wavelength of light, whereby to create, by Bragg reflection, photonic band gaps for transmitted light.

Figure 15:
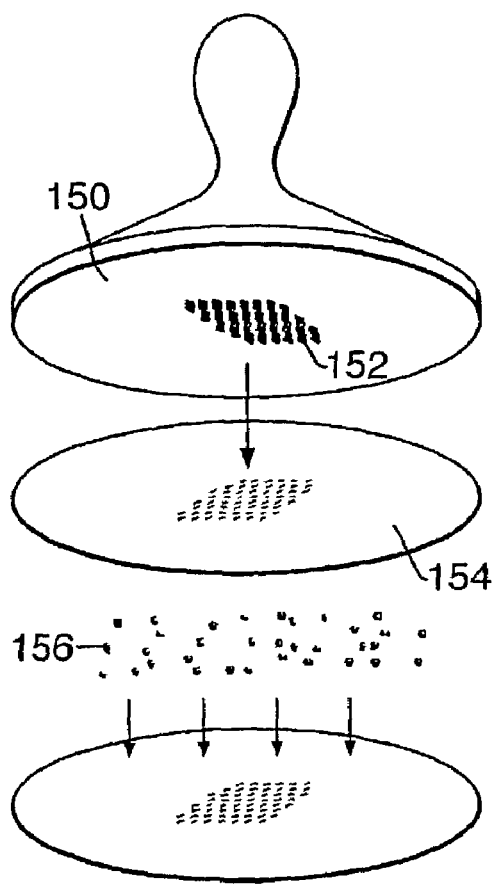

Referring to FIG. 15, there is shown the fabrication of nanotube arrays by the method in accordance with the invention, wherein a stamp 150 with protrusions 152 having lateral dimensions less than 20 nanometers is pressed against a substrate 154 to create locally charged regions. Nanometer sized particles 156 of the opposite charge type deposited on the substrate to adhere to the locally charged regions. Using the nanoparticles as seeds, arrays or filaments of carbon nanotubes 158 can be grown by chemical vapour deposition methods. This has application in field emission applications.

Figure 16:
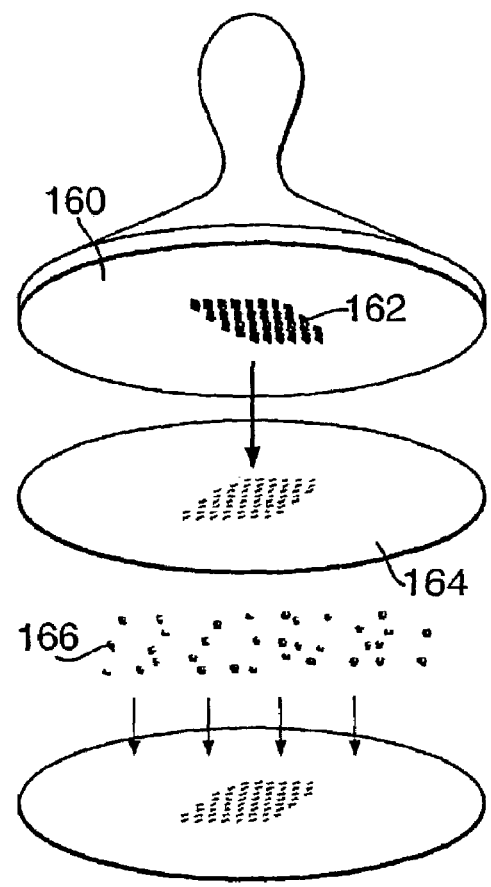
Figure 16:
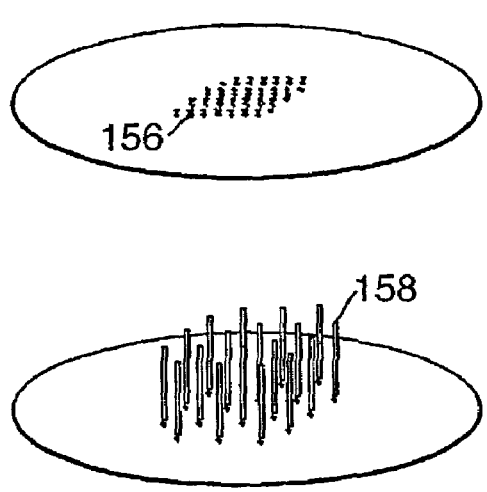
Figure 16:
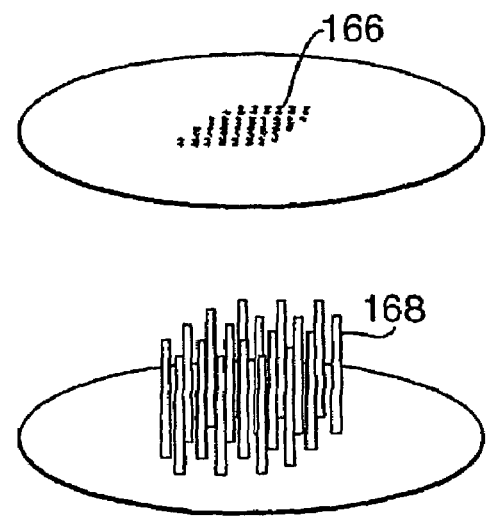

Referring to FIG. 16, there is shown the fabrication of nanorod arrays in accordance with the invention, wherein a stamp 160 with protrusions 162 having lateral dimensions of less than 20 nanometers is pressed against a substrate 164 to create locally charged regions. Nanometer sized particles 166 are deposited on the locally-charged regions, and these particles are used as seeds to create filaments or nanorods, for example semiconducting or magnetic materials, which are grown by chemical vapour deposition methods.

Figure 17:
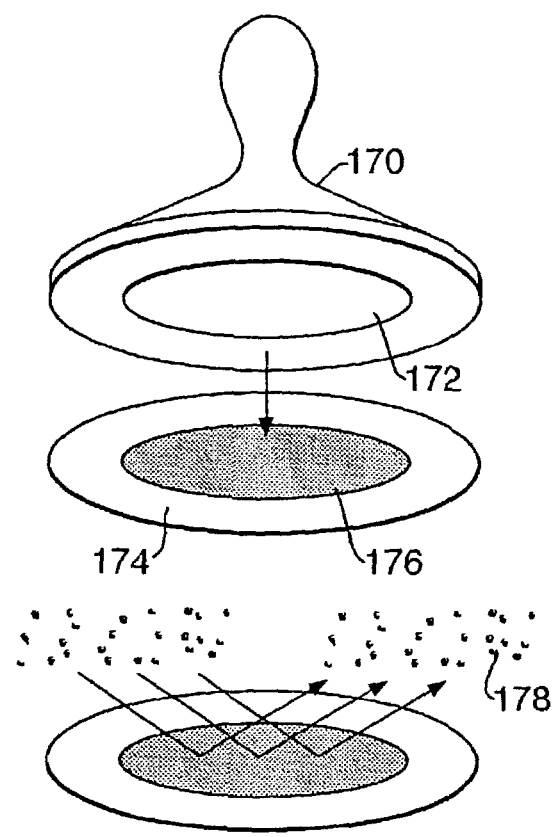

Referring to FIG. 17, there is shown a method of electrically charging of aerosol particles. A stamp 170 having metallised protrusions with lateral dimensions of the order of centimeters 172 is pressed against a substrate 174 to create a charged region 176. Neutral aerosol particles are directed to the surface at high speed, thus rebounding on the substrate and taking away respective charged units from the charged region 176. Alternatively the substrate may not be electrically charged. The aerosol particles are nevertheless effective to "extract" electrical charge from the substrate by the impaction process.

Figure 18:
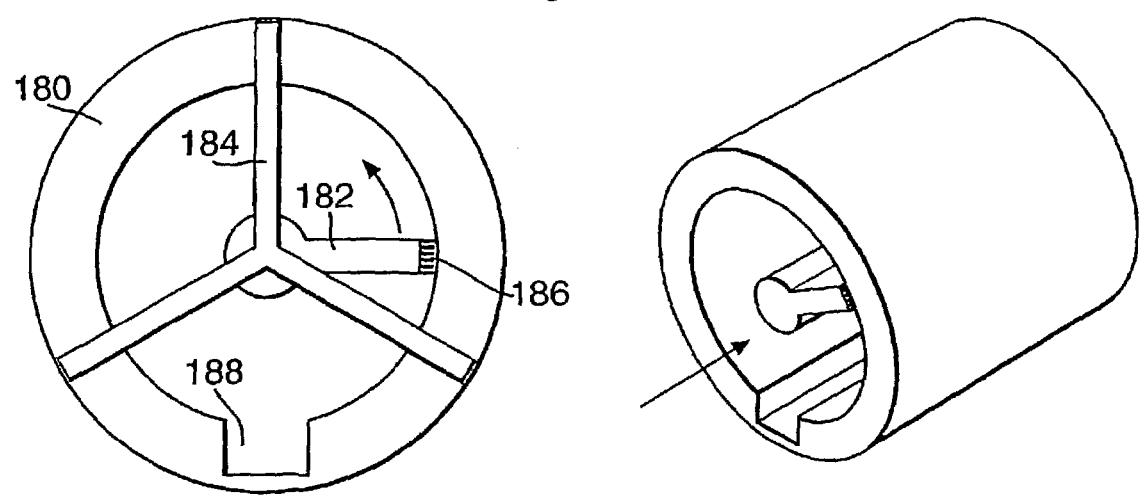

Referring to FIG. 18, there is shown a method for removing soot particles from exhaust gas streams wherein a cylinder 180 of insulating material, positioned in an exhaust pipe, of for example an engine, has a rotating metallic brush 182 mounted centrally on pipe 180 by supports 184. The metal brush has metal filaments 186 contacting the inner wall, and as it rotates it charges the inner surface of the wall with negative charge. The cylinder may be of silicon oxide, glass or ceramic. At an earlier stage, particles in the exhaust gas are positively charged, either as the result of the combustion process or by a separate means such as a charger. These charged particles are then deposited on the cylinder wall. The brush functions to wipe the particles from the wall into a exhaust channel 188 for further treatment.

Figure 19A:
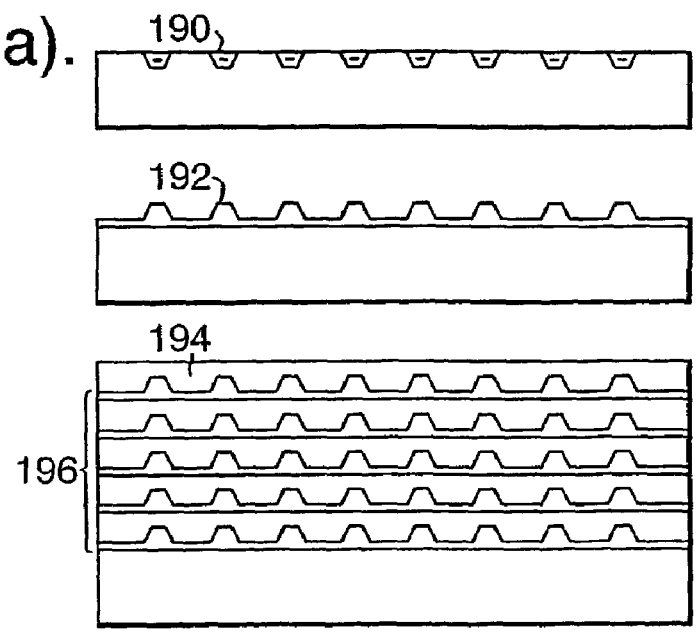

Referring now to FIG. 19, there is shown a method of seeding epitaxial self-assembled dots for two and three dimensional arrays of quantum dots, by the method in accordance with the invention. As shown in FIG. 19a locally charged regions 190 are created by the method in accordance with the invention. Using an epitaxial method, self-assembled dots 192 are formed on the locally charged dots. The epitaxial method may be molecular beam, a chemical beam or metal-organic vapour phased epitaxy, or any combination thereof. An insulating layer 194 is then grown over particles 192, and this process is repeated to create three dimensional arrays 196 of quantum dots.

Figure 19B:
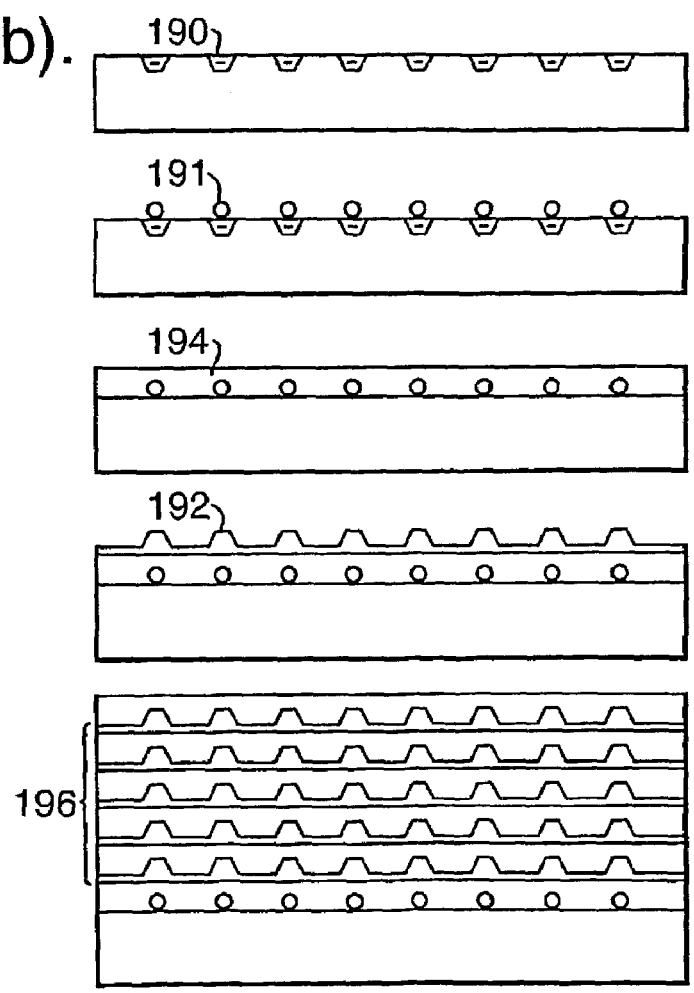

In FIG. 19b the method is somewhat similar to that shown in FIG. 19a and similar parts denoted by the same reference numeral. However, in an initial step nanoparticles, for example tungsten, 191 are deposited on the electrically charged arrays by the method in accordance with the invention. Using an epitaxial method, a thin buffer layer 194 is grown to cover the particles. In the next epitaxial step, self-assembled dots 192 are formed on top of the embedded particles as described in the rest of FIG. 19a. A prolonged epitaxial process will create three dimensional arrays 196 of quantum dots.

Figure 20:
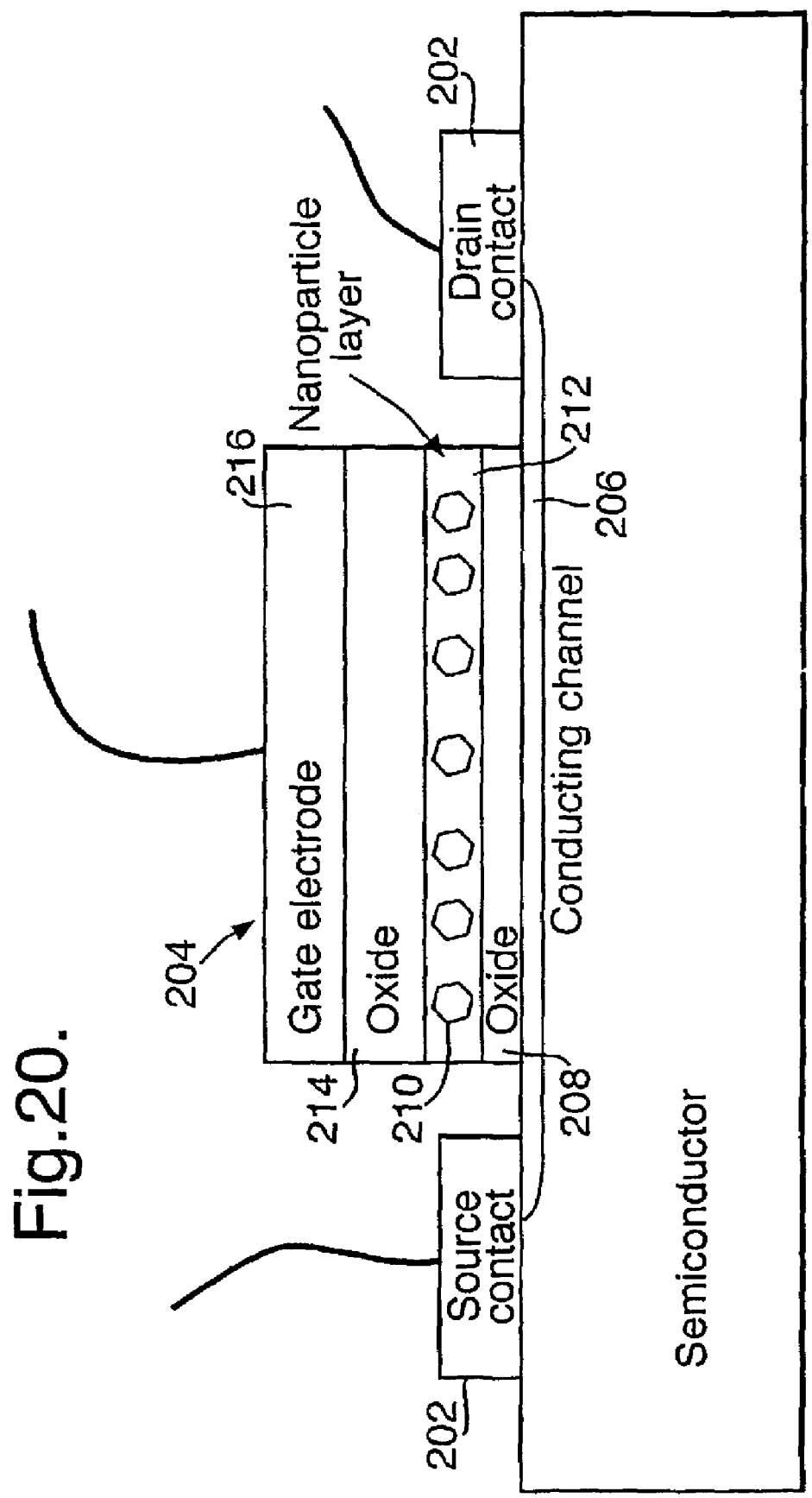

Referring to FIG. 20, a flash memory structure comprises a substrate 200 with source and drain electrodes 202. A gate structure 204 overlies a conducting channel 206. The gate structure comprises an oxide layer 208, a nanoparticle layer comprising nanoparticles 210 in an epitaxial overgrowth 212, and a further oxide layer 214, with a final metallic gate electrode 216. The nanoparticles 210 have the capacity for charge storage, and may be of any suitable material. In the formation of the structure, the oxide layer 208 is initially grown over the surface of the substrate, and then the nanoparticles are applied by the stamp process, as above. Successive further steps of epitaxial overgrowth and selective etching create the structure shown.

The invention claimed is:

1. A method comprising the steps of:
    forming one or more electrically-charged regions of predetermined shape on an insulating surface of a solid first material by contacting portions of said surface corresponding to said one or more regions with a solid material of a tool so as to transfer electric charge from said tool to said surface; and
    permitting particles of a second material to flow in a vicinity of said one or more electrically-charged regions, to interact with said one or more electrically-charged regions.

2. A method according to claim 1, wherein said particles are of nanometric dimensions.

3. A method according to claim 1, wherein the second material is different from the first material.

4. A method according to claim 1, wherein said one or more electrically-charged regions are charged with a charge of a first sign, and said particles are charged with charge of a second sign, the second sign being opposite to that of the first sign.

5. A method according to claim 1, wherein said one or more electrically-charged regions are charged with a charge of a first sign, and said particles are charged with a charge of a second sign, the second sign being the same as the first sign.

6. A method according to claim 4, wherein said particles each carry one or more electric charges.

7. A method according to claim 1, wherein an electric field is provided in a direction towards said surface so as to enhance the flow of said particles towards said surface.

8. A method according to claim 7, wherein the electric field induces a charge polarisation of said particles, which is effective to deposit said particles on said surface.

9. A method according to claim 1, wherein said particles are deposited on said surface in areas determined by said one or more electrically-charged regions in order to fabricate a structure.

10. A method according to claim 9, wherein said particles are deposited on said one or more electrically-charged regions.

11. A method according to claim 9, wherein said particles are deposited on said surface on areas other than said one or more electrically-charged regions.

12. A method according to claim 1, wherein said particles are electrically neutral, and are projected against said one or more electrically-charged regions to absorb electrical charge, and to rebound from said surface in an electrically-charged condition.

13. A method according to claim 1, wherein the tool comprises a stamp having a contoured surface with protrusions which is contacted with said surface of the first material and which has a configuration conforming to said portions of said surface of the first material.

14. A method according to claim 1, wherein the tool comprises an elongate object which is pressed against said surface of the first material and drawn across said surface in a desired path to define said one or more electrically-charged regions.

15. A method according to claim 1, wherein the tool is a tip of a scanning probe microscope.

16. A method according to claim 1, wherein said surface is prepared so as to have no significant water or other conductive contamination.

17. A method according to claim 1, wherein said particles are arranged to flow as an aerosol.

18. A method according to claim 1, wherein said particles are arranged to flow as a suspension in a liquid.

19. A method according to claim 1, wherein the second material is metallic, and the particles are deposited on said surface of the first material and subsequently annealed to form metal seeds, and further comprising growing semiconductor filaments or nanorods on the metal seeds by a chemical vapor deposition method.

20. A method according to claim 1, wherein in a second stage of the method, said steps are repeated with respect to a different one or more electrically-charged regions of a different predetermined shape or size.

21. A method according to claim 1, including a further step of epitaxial overgrowth of said particles of the second material, and wherein the first material, said particles, and material of said epitaxial overgrowth form a laser structure.

22. A method according to claim 21, wherein additional particles are deposited in subsequent steps, each step using particles of different laser characteristics.

23. A method according to claim 1, including depositing said particles on said surface of the first material for a sufficient period to create filaments of the second material upstanding from said surface.

24. A method as claimed claim 1, including providing a voltage bias between said tool and said surface.

25. A method comprising the steps of:
(a) forming one or more electrically-charged regions of predetermined shape on a surface of a first material by contacting portions of said surface corresponding to said one or more regions with a tool so as to transfer electric charge from said tool to said surface;
(b) forming on said one or more electrically-charged regions, self assembled dots by an epitaxial method; and
(c) growing an intermediate layer on the self-assembled dots, and repeating said steps (b) and (c) a desired number of times.

26. A method comprising the steps of:
forming one or more electrically-charged regions of predetermined shape on a surface of a solid first material by contacting portions of said surface corresponding to said one or more regions with a solid material of a tool so as to transfer electric charge from said tool said surface; and
permitting particles of a second material to flow in a vicinity of said one or more electrically-charged regions, to interact with said one or more electrically-charged regions,
wherein the tool comprises a stamp having a contoured surface which is contacted with said surface of the first material and which has a configuration conforming to said portions of said surface of the first material.

27. A method according to claim 26, wherein said particles are of nanometric dimensions, and the particles are subsequently annealed to form metal seeds, and further comprising growing semiconductor filaments or nanorods on the metal seeds by a chemical vapor deposition method.

28. A method according to claim 26, wherein said surface is prepared so as to have no significant water or other conductive contamination.

29. A method according to claim 26, wherein said surface is an insulating surface of a semiconductor substrate and the contoured surface has protrusions.

30. A method according to claim 29, wherein said insulating surface is an oxide surface.

31. A method comprising the steps of:
forming one or more electrically-charged regions of predetermined shape on a surface of a solid first material by contacting portions of said surface corresponding to said one or more regions with a solid material of a tool so as to transfer electric charge from said tool to said surface; and
permitting particles of a second material to flow in a vicinity of said one or more electrically-charged regions, to interact with said one or more electrically-charged regions,
wherein the method further includes a step of epitaxial overgrowth of said particles of the second material, and the first material, said particles, and material of said epitaxial overgrowth form a laser structure.

32. A method according to claim 31, wherein additional particles are deposited in subsequent steps, each step using particles of different laser characteristics.

33. A method according to claim 31, wherein said surface is an insulating surface of a semiconductor substrate.

34. A method according to claim 33, wherein said insulating surface is an oxide surface.

35. A method comprising the steps of:
forming one or more electrically-charged regions of predetermined shape on a surface of a solid first material by contacting portions of said surface corresponding to said one or more regions with a solid material of a tool so as to transfer electric charge from said tool to said surface; and
permitting particles of a second material to flow in a vicinity of said one or more electrically-charged regions, to interact with said one or more electrically-charged regions,
wherein said particles are deposited on said surface of the first material for a sufficient period to create filaments of the second material upstanding from said surface.

36. A method according to claim 35, wherein said surface is an insulating surface of a semiconductor substrate.

37. A method according to claim 36, wherein said insulating surface is an oxide surface.

38. A method according to claim 1, wherein said insulating surface is formed on a semiconductor substrate.

39. A method according to claim 38, wherein said insulating surface is an oxide surface.

40. Apparatus comprising:
a tool having a portion of solid material constructed to contact one or more portions of predetermined shape on a surface of a solid first material in order to transfer electric charge from said tool to said surface and thereby form one or more electrically-charged regions on said surface; and
a system constructed to permit particles of a second material to flow in a vicinity of said one or more electrically-charged regions, to interact in a predetermined manner with said one or more electrically-charged regions,
wherein the tool comprises a stamp having a contoured surface, for contacting said surface of the first material, with a configuration conforming to said one or more portions of the predetermined shape.

41. Apparatus according to claim 40, including an aerosol device which produces said particles so as to have nanometric dimensions.

42. Apparatus according to claim 41, wherein said aerosol device is arranged to electrically charge said particles and wherein the tool comprises a stamp having a contoured surface with protrusions.

43. Apparatus according to claim 40, including a device constructed to produce an electric field in a direction towards said surface so as to enhance the flow of said particles towards said surface.

44. Apparatus comprising:
tool means for forming one or more electrically charged regions of predetermined shape on a surface of a first material by contacting portions of said surface corresponding to said one or more regions; and
means for permitting particles of a second material to flow in a vicinity of said regions, to interact in a predetermined manner with said regions.

* * * * *